United States Patent
Yamamoto et al.

(10) Patent No.: US 6,448,172 B1
(45) Date of Patent: Sep. 10, 2002

(54) MANUFACTURING METHOD OF FORMING INTERCONNECTION IN SEMICONDUCTOR DEVICE

(75) Inventors: Yoshiaki Yamamoto; Toshiyuki Hirota, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/512,246

(22) Filed: Feb. 24, 2000

(30) Foreign Application Priority Data

Feb. 25, 1999 (JP) .......................................... 11-048623

(51) Int. Cl.⁷ .......................................... H01L 21/4763
(52) U.S. Cl. ..................... 438/618; 438/625; 438/636; 438/656; 438/660; 438/668
(58) Field of Search ................................. 438/618, 622, 438/636, 642, 625, 644, 626, 648, 688, 660, 656, 658, 663

(56) References Cited

U.S. PATENT DOCUMENTS 5,171,642 A    12/1992   DeHaven et al.

FOREIGN PATENT DOCUMENTS

| GB | 0 875 923 A2 | 11/1998 |
|---|---|---|
| JP | 07-058110 | 3/1995 |
| JP | 09-289212 | 11/1997 |
| JP | 10-125676 | 5/1998 |

*Primary Examiner*—Chandra Chaudhari
*Assistant Examiner*—Jack Chen
(74) *Attorney, Agent, or Firm*—Katten Muchin; Zavis Rosenman

(57) ABSTRACT

In forming an interconnection having a structure in which an Al interconnection is covered with an interlayer insulating film, for the purpose of preventing voids to be created in the Al interconnection layer, together with suppressing the current leakage owing to the generation of etching residues, a multi-layered structure including a barrier layer (4), an Al interconnection metal layer (5), a Ti layer (2*b*) and an anti-reflection layer (6) is formed on a semiconductor substrate having an insulating surface, and thereafter layers of said multi-layered structure are patterned, at least, down to the Ti layer (2*b*) into the shape of structure is heated so as to turn the Ti layer (2*b*) into an AlTi alloy layer and, then, the steps of growing an interlayer insulating film to bury said patterned interconnection planarizing the interlayer insulating film and carrying out another heat treatment to degas the interlayer insulating film are performed.

4 Claims, 6 Drawing Sheets

MANUFACTURING METHOD OF FORMING INTERCONNECTION IN SEMICONDUCTOR DEVICE

BACKGROUND OF THE INVENTION

1. Field of the Invention

The present invention relates to a manufacturing method of a semiconductor device and more particularly to a manufacturing method of an aluminium (Al) interconnection utilized for a multi-layered interconnection in a semiconductor integrated-circuit device.

2. Description of the Related Art

For an interconnection layer in a semiconductor device, aluminium (Al), Al—Cu alloy in which copper is added into Al or the like has been in use for some time. Generally, in a method of forming an interconnection, a resist-pattern is first formed by means of photolithography (PR) and, then, using that pattern as a mask, dry etching is applied thereto. For an Al interconnection, however, because of a particularly high reflectance of the Al surface, an anti-reflection layer of TiN or the like is formed and a resist pattern is formed thereon. Further, when an interconnection is formed to have a multi-layered structure, a Ti layer is formed between the anti-reflection layer and the Al layer, since the contact resistance between an upper layer interconnection and a lower layer interconnection becomes too high if the TiN layer alone is used.

FIGS. 3(a)–(g) are schematic cross-sectional views illustrating the steps of a method of forming an interconnection. First, on a semiconductor substrate having an insulating surface such as a plasma $SiO_2$ film 1, a barrier layer 4 consisting of, for example, a Ti layer 2a and a TiN layer 3a is formed and, over that, an Al layer 5 made of either a simple substrate of Al or an Al—Cu alloy is formed, and thereon an anti-reflection layer 6 consisting of a Ti layer 2b and a TiN layer 3b is further formed to make up a multi-layered structure (FIG. 3(a)).

Next, after a resist pattern 7 is formed into the shape of an interconnection pattern (FIG. 3(b)), using that pattern as a mask, said multi-layered structure is patterned by means of dry etching (FIG. 3(c)).

After removing the resist (FIG. 3(d)), an interlayer insulating film 9 is grown (FIG. 3(e)), and then the surface of the interlayer insulating film 9 is planarized by the CMP (Chemical Mechanical Polishing) method (FIG. 3(f)). Finally, in order to degas the interlayer insulating film, a heat treatment is applied thereto in a nitrogen atmosphere under the condition that the temperature is 300 to 500° C., and thereby the formation of one layer within a multi-layered interconnection is accomplished (FIG. 3(g)).

However, heating at the time of the formation of the interlayer insulating film or in the final step of the heat treatment induces the alloying reaction to make an AlTi alloy in the vicinity of the interface between the Al layer 5 and its overlying Ti layer 2 and forms an alloy layer 8. This leads to the creation of voids 11 in the Al metal interconnection layer 5, which gives rise to problems such as the severance of the interconnection.

Meanwhile, it is known that the resistance against electromigration can be raised by sandwiching an Al interconnection layer with the Ti layers, though the composition of the layers is somewhat different from that of the present invention, and there also has been proposed a method wherein, after forming a Ti/Al/Ti layered structure, respective Ti layers and the Al layer therein are positively made to react with each other by heating the substrate up to a temperature of 300 to 500° C. so as to form a $Al_3Ti/Al/Al_3Ti$ layered structure.

Further, in JP-A-10-125676, it is disclosed that, if a heat treatment is applied to an Al alloy layer that is arranged to lie next to an alloy layer of Al and either a refractory metal or a transition metal, in this instance, an Al—Ti layer, the amount of a reduction in the film thickness of the Al alloy layer can be made smaller, compared with that in the case a heat treatment is applied to an Al alloy layer lying next to a Ti layer, and, therefore, an increase in the resistance of the Al interconnection can be controlled.

In order to prevent voids to be created in the Al layer 5, a method in which a heat treatment is performed preliminarily to induce the alloying reaction in a similar way to the above methods, and, thereafter, patterning, formation of an interlayer insulating film, planarization and annealing for degassing are performed can be considered. The investigations conducted by the present inventors, however, found this method has various problems.

The first problem is that, when patterning is performed after an alloy is made, etching residues are generated so that a problem of the current leakage may occur. This results from a fact that the alloy layer, in comparison with normal metal layers, is hard to etch and besides granular crystals are formed therein as an alloy is made and those grains are liable to remain as etching residues.

The second problem is that, unless the proceeding of the alloying reaction within the remaining patterned portions of the multi-layered structure is thorough, the heat treatment for degassing starts the alloying reaction again and creates voids. Consequently, the duration of the first heat treatment must be set long enough to allow the alloying reaction to proceed to the full.

SUMMARY OF THE INVENTION

Accordingly, an object of the present invention is to provide a method of manufacturing a semiconductor device having an Al interconnection wherein creation of voids is prevented and the required duration of a heat treatment is not inappropriately long for practical purposes.

In light of the above problems, the present invention provides a method of manufacturing a semiconductor device; which comprises the steps of:

forming, on a semiconductor substrate having an insulating surface, a multi-layered structure comprising a barrier layer, an interconnection metal layer made of Al or an alloy whose main component is Al, a Ti layer to lie over said interconnection metal layer and an anti-reflection layer to lie over said Ti layer;

patterning said multi-layered structure into the shape of an interconnection pattern;

carrying out a heat treatment in which said patterned structure is heated so as to bring about an alloying reaction between Al in said interconnection metal layer and Ti, at least in the vicinity of the interface between said interconnection metal layer and Ti layer, and form an AlTi alloy layer;

growing an interlayer insulating film, burying said patterned interconnection;

planarizing the interlayer insulating film; and carrying out another heat treatment in order to degas the interlayer insulating film.

Further, the present invention provides a method of manufacturing a semiconductor device; which comprises the steps of:

forming, on a semiconductor substrate having an insulating surface, a multi-layered structure comprising a barrier layer, an interconnection metal layer made of Al or an alloy whose main component is Al, a Ti layer to lie over said interconnection metal layer, an anti-reflection layer to lie over said Ti layer and a $SiO_2$ layer to lie over said anti-reflection layer;

patterning the $SiO_2$ layer, the anti-reflection layer and the Ti layer in said multi-layered structure into the shape of an interconnection pattern;

carrying out a heat treatment in which said patterned structure is heated so as to bring about an alloying reaction between Al in said interconnection metal layer and Ti, at least in the vicinity of the interface between said interconnection metal layer and Ti layer, and form an AlTi alloy layer;

patterning the interconnection metal layer and the barrier layer, using said patterned $SiO_2$ layer as a mask;

growing an interlayer insulating film, burying said patterned interconnection;

planarizing the interlayer insulating film; and carrying out another heat treatment in order to degas the interlayer insulating film.

In the present invention, before forming an AlTi alloy that is hard to etch, either an interconnection pattern is formed or layers lying over the Ti layer in which the AlTi alloy is to be formed are patterned. These techniques suppress the generation of etching residues and thus eliminate the problem of the current leakage, and, in addition, prevent voids from being created within the Al interconnection layer in the step of the heat treatment of the post-treatment steps so that a method of manufacturing a semiconductor device with a high yield can be provided.

DETAILED DESCRIPTION OF THE PREFERRED EMBODIMENTS

Figure 1A:
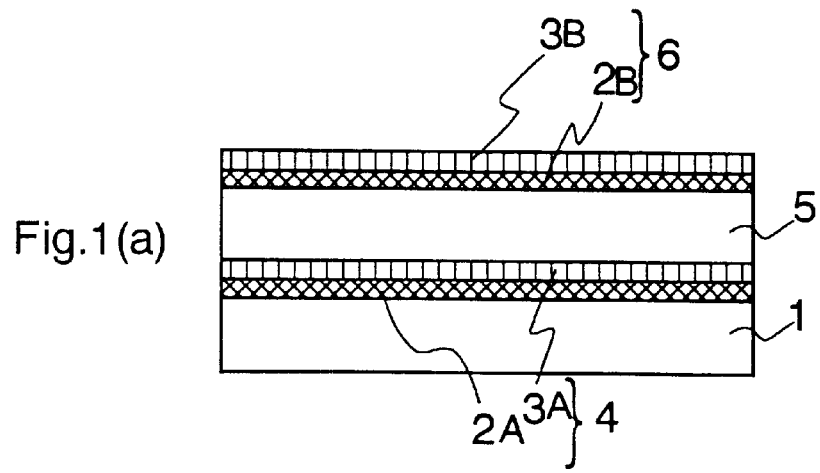
FIGS. 1(a)–(g) are schematic cross-sectional views illustrating the steps of a manufacturing method of a semiconductor device that is an embodiment of the present invention.

The present inventors conducted detailed investigations over the creation of the voids in the Al interconnection layer and found out that it is caused not only by the consumption of Al to make an alloy of AlTi but also by the shifts of Al atoms under heat stress.

When a TiN layer alone was formed directly over an Al interconnection layer without forming a Ti layer, and, then, patterning, formation of an interlayer insulating film and annealing for degassing were carried out, it was observed that voids were formed as ever, although the rate of void creation was lowered. This clearly indicates that the consumption of Al to make an alloy of AlTi is not the sole cause for the void creation.

It is thought that while shifts of Al atoms or changes in crystal structure occur when the heat stress is applied, being surrounded solidly by an interlayer insulating film, these shifts of atoms or changes in crystal structure are very much restricted physically and, consequently, create voids locally.

The present inventors, thus, considered applying the heat stress before an interlayer insulating film is grown. However, in such a method wherein the heat stress is applied prior to the patterning as described in the afore-mentioned Japanese Patent Application Laid-open No. 125676/1998, the AlTi alloy layer being formed is hard to etch and, with etching residues generated, a problem of the current leakage or the like arises. The generation of the residues of the alloy layer can be prevented, without question, by forming a thick resist mask and subsequently overetching. Nevertheless, as the miniaturization of the interconnections advances, such means have become inappropriate to cope with the above problems.

Accordingly, to overcome the above problems, the present invention employs another novel technique wherein, before an alloy layer hard to etch is formed, at least a Ti layer that is to be turned into the alloy layer is patterned, and thereafter a heat treatment is performed.

In the present invention, the film thickness of the Ti layer formed to lie next to the Al interconnection layer is preferably in the range 5 to 25 nm. For a film thickness of less than 5 nm, it may be difficult to form a layer having a uniform film thickness all over. On the other hand, if the film thickness exceeds 25 nm, the duration required for the alloying treatment may become considerably long and impractical.

Now, referring to the drawings, the present invention is described in detail below.

FIGS. 1(a)–(g) are schematic cross-sectional views illustrating the steps of a method of forming an interconnection that is an embodiment of the present invention.

First, on a semiconductor substrate having an insulating surface such as a plasma $SiO_2$ film 1, a barrier layer 4 consisting of, for example, a Ti layer 2a with a thickness of 30 nm and a TiN layer 3a with a thickness of 100 mm is formed and, over that, an interconnection metal layer 5 made of an Al—Cu alloy is formed to a thickness of 450 nm, and thereon an anti-reflection layer 6 consisting of a Ti layer 2b with a thickness of 15 and a TIN layer 3b with a thickness of 50 nm is further formed to make up a multi-layered structure (FIG. 1 (a)). Further, for the interconnection metal layer 5, pure Al or an Al—Si—Cu alloy can be used as well.

Figure 1B:
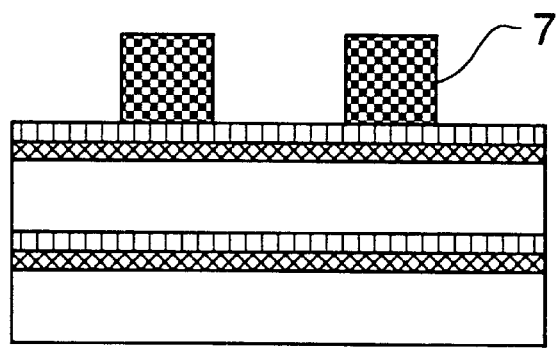
Figure 1C:
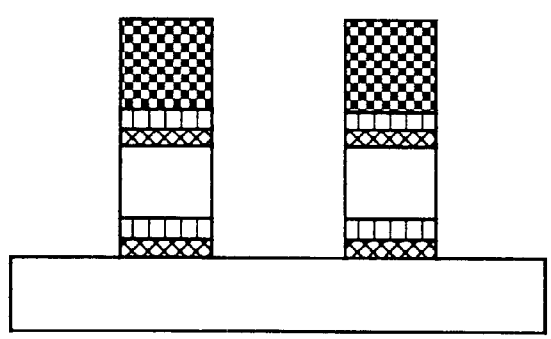
Figure 1D:
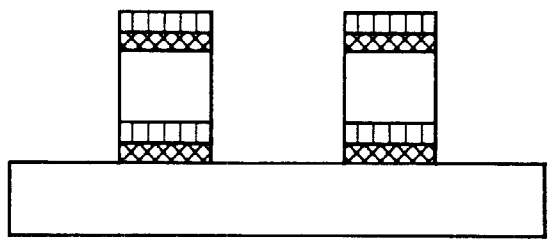
Figure 1E:
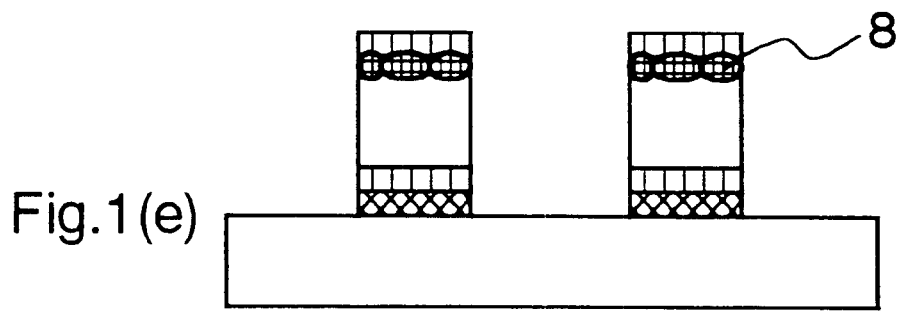
Figure 1F:
Figure 1F:
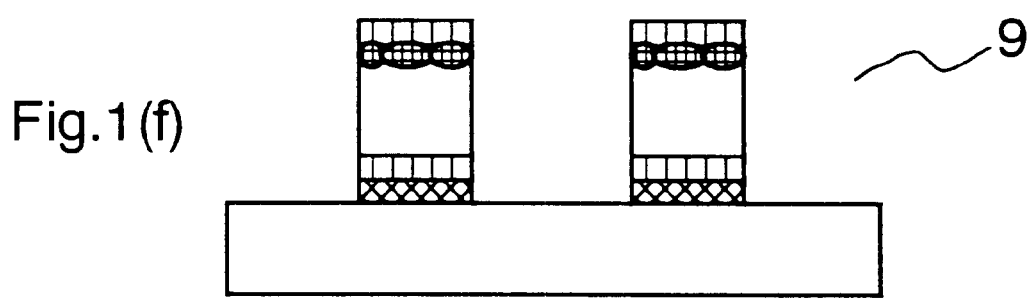
Figure 1G:
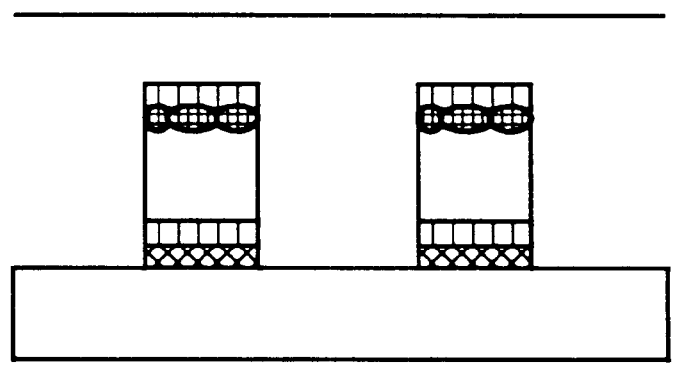

Next, after a resist pattern 7 is formed into the shape of an interconnection pattern (FIG. 1(b)), using that pattern as a mask, said multi-layered structure is patterned by means of dry etching with a Cl-based gas such as $Cl_2$ or $BCl_3$ being used (FIG. 1(c)). After that, the resist is removed and a structure of FIG. 1(d) is obtained.

After removing the resist, annealing in an atmosphere of an inert gas such as $N_2$ or Ar is carried out in a diffusion furnace or a RTP (Rapidly Thermal Processing) apparatus. The temperature and the duration hereat depend on the film thickness of the Ti layer 2b in the anti-reflection layer 6. For example, when a diffusion furnace is used, annealing is performed at 400° C. for 10 minutes or longer, if the Ti layer is 15 nm thick, and at 400° C. for 60 minutes or longer, if 25 nm thick. In the above case, the temperature and the duration were 400° C. and 10 minutes, respectively. Such an annealing treatment turns the Ti layer in the anti-reflection layer 6 into an alloy layer 8 (FIG. 1 (e)). Subsequently, a $SiO_2$ film is grown as an interlayer insulating film 9 to a thickness of 1400 nm by the CVD (Chemical Vapour Deposition) method (FIG. 1(f)), and then the surface of the interlayer insulating film 9 is planarized by the CMP method (FIG. 1(g)). Finally, in order to degas the interlayer insulating film, a heat treatment is applied thereto in a nitrogen atmosphere under the condition that the temperature is 300 to 500° C., and thereby the formation of one layer within a multi-layered interconnection is accomplished. In this instance, the heat treatment was performed at 350° C. for 10 minutes or so.

To establish the condition of the interconnection, all the layers lying over the Al interconnection metal layer were removed and a close examination was made. The result confirmed no voids had been created therein.

FIGS. 2(a)–(g) are schematic cross-sectional views illustrating the steps of a manufacturing method that is another embodiment of the present invention.

First, on semiconductor substrate having an insulating surface such as a plasma $SiO_2$ film 1, a barrier layer 4 made of, for example, a TiN layer with a thickness of 50 nm is formed and, over that, an interconnection metal layer 5 made of an AlCu alloy is formed to a thickness of 450 nm, and thereon an anti-reflection layer 6 consisting of a Ti layer 2b with a thickness of 15 nm and a TIN layer 3b with a thickness of 50 nm, and, further over that, a $SiO_2$ layer 10 with a thickness of 300 nm are formed to make up a multi-layered structure (FIG. 2 (a)).

Figure 2A:
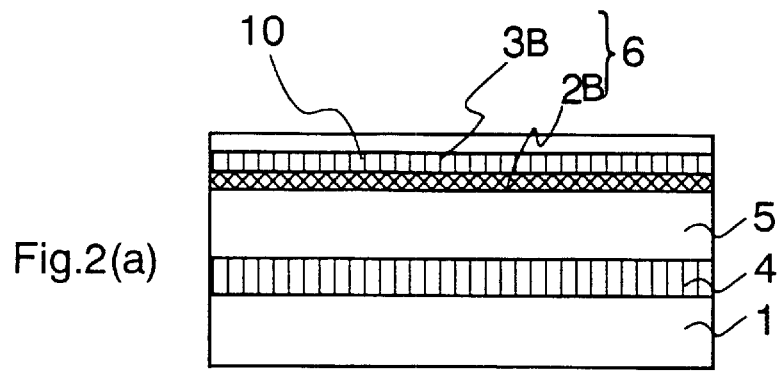
FIGS. 2(a)–(g) are schematic cross-sectional views illustrating the steps of a manufacturing method of a semiconductor device that is another embodiment of the present invention.
Figure 2B:
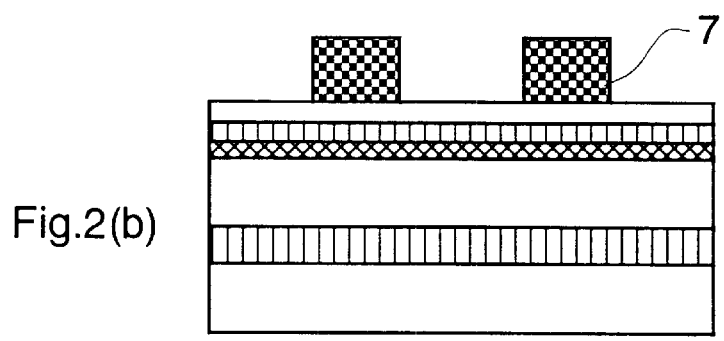
Figure 2C:
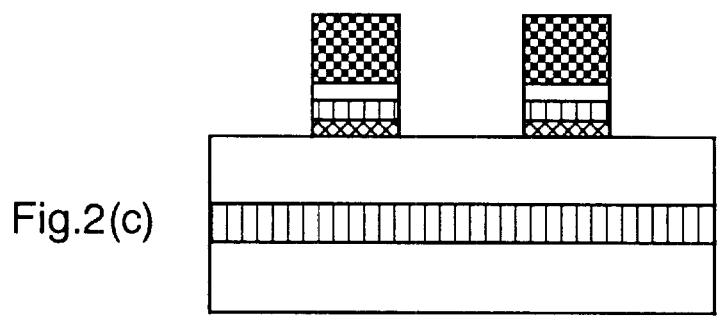
Figure 2D:
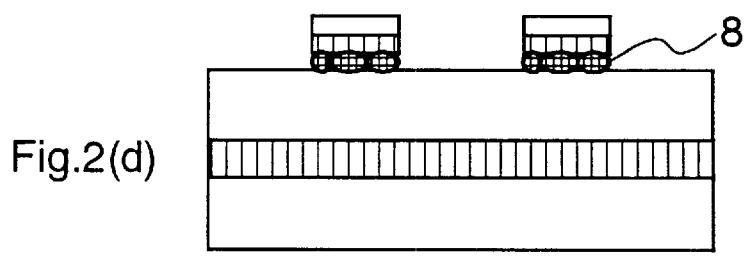

Next, after a resist pattern 7 is formed into the shape of an interconnection pattern (FIG. 2(b)), using that pattern as a mask, layers lying over the metal interconnection layer 5 within said multi-layered structure are patterned by means of dry etching, firstly with a CF-based or CHF-based gas being used for the $SiO_2$ layer 10 and then with a Cl-based gas for the TiN layer as well as the Ti layer (FIG. 2(c)).

After removing the resist, annealing in an atmosphere of an inert gas such as $N_2$ or Ar is carried out in a diffusion furnace or a RTP apparatus. When a diffusion furnace is used, annealing is performed at 400° C. for 10 minutes or so. Such an annealing treatment turns the Ti layer 2b in the anti-reflection layer 6 into an alloy layer 8 (FIG. 2 (d)).

Figure 2E:
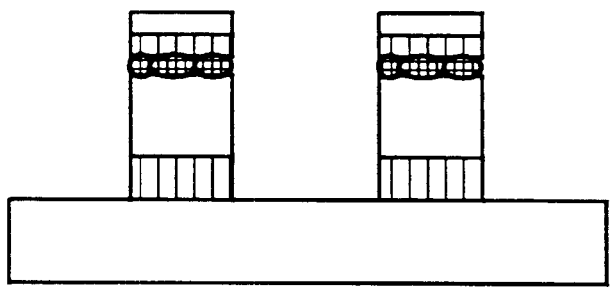
Figure 2F:
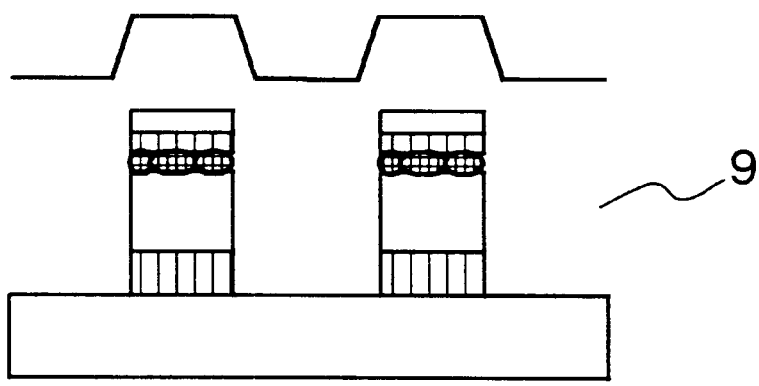
Figure 2G:
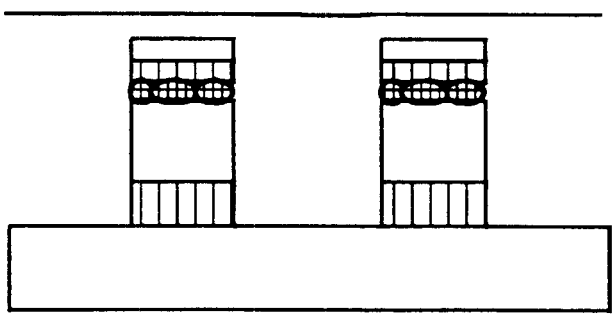
Figure 3A:
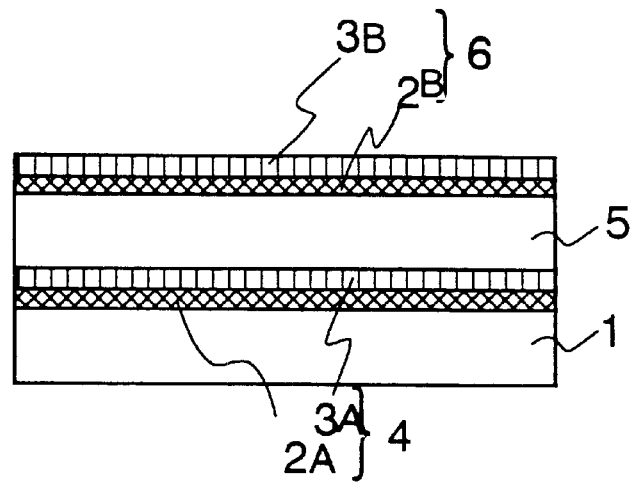
FIGS. 3(a)–(g) are schematic cross-sectional views illustrating the steps of a conventional manufacturing method of a semiconductor device.
Figure 3B:
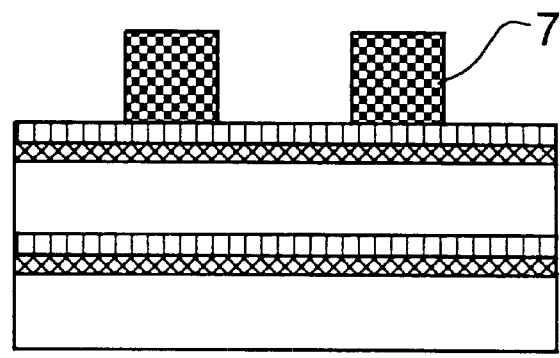
Figure 3C:
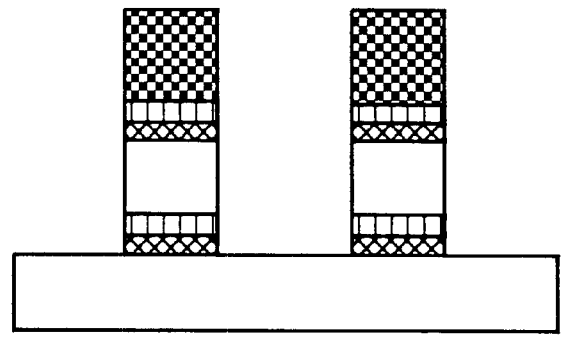
Figure 3D:
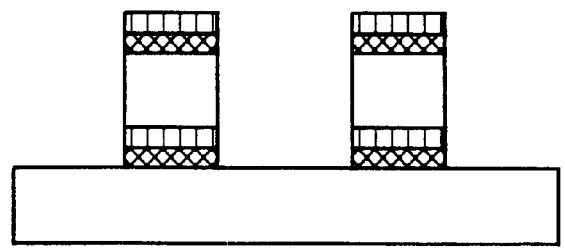
Figures 3E, 3F, 3G:
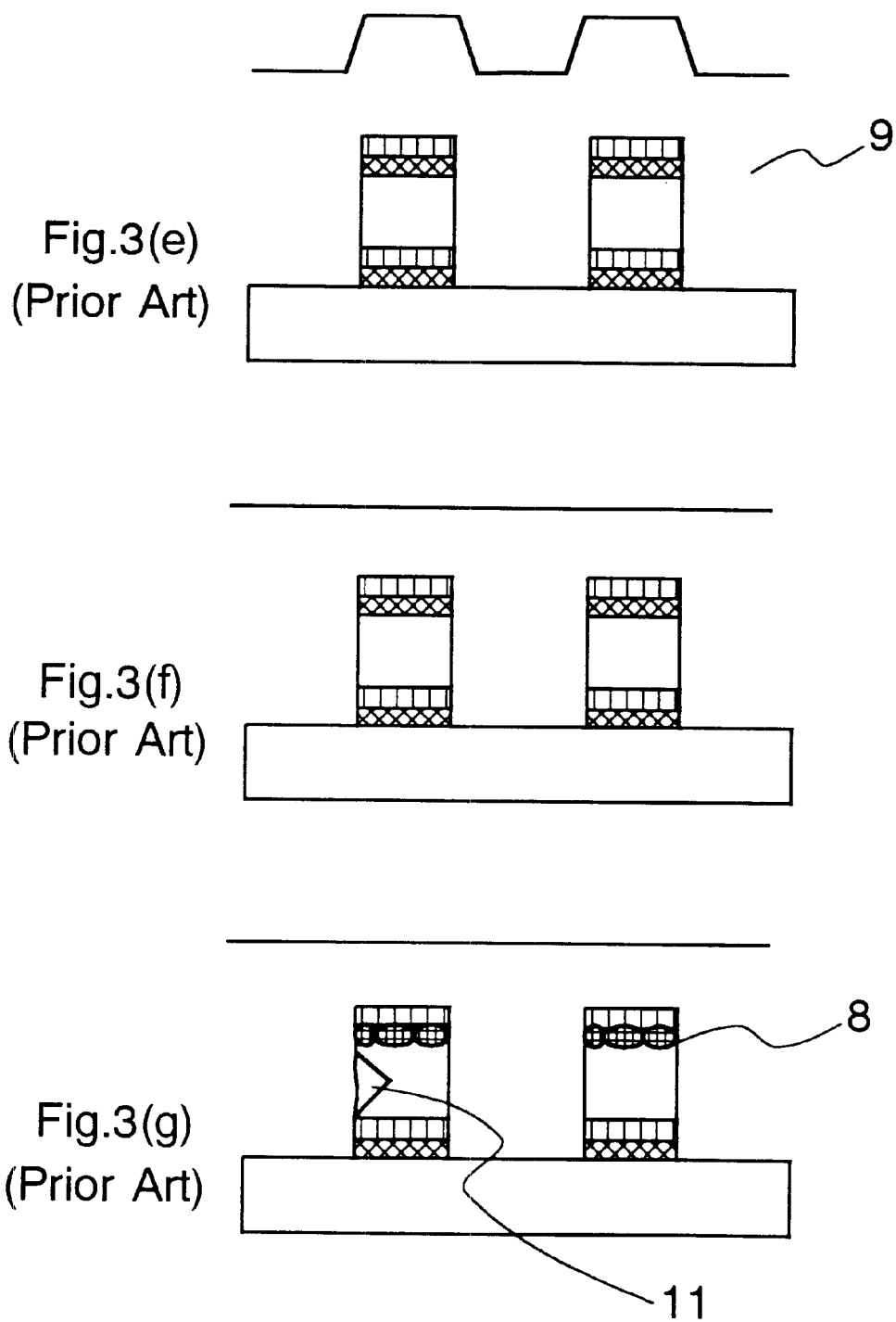

Subsequently, using the $SiO_2$ layer 10 that remains on the uppermost surface of the multi-layered structure as a mask, etching is applied to the metal interconnection layer 5 and the barrier layer 4, in succession, and an interconnection pattern is formed (FIG. 2(e)). After that, a $SiO_2$ film is grown as an interlayer insulating film 9 to a thickness of 1400 nm by the CVD method (FIG. 2(f)), and then the surface of the interlayer insulating film 9 is planarized by the CMP method (FIG. 2(g)). Finally, in order to degas the interlayer insulating film, a heat treatment is applied thereto in a nitrogen atmosphere under the condition that the temperature is 300 to 500° C., and thereby the formation of one layer within a multi-layered interconnection is accomplished. In this instance, the heat treatment was performed at 350° C. for 10 minutes or so.

In this embodiment, no etching is applied to the metal interconnection layer serving as a source to supply Al that is necessary to form the AlTi alloy layer 8. Consequently, a reduction in the height of the interconnections that occurs along with alloying is made by far smaller and, therefore, an excellent interconnection structure can be provided.

What is claimed is:

1. A method of manufacturing a semiconductor device, which comprises the steps of:

forming, on a semiconductor substrate having an insulating surface, a multi-layered structure comprising a barrier layer, an interconnection metal layer made of Al or an alloy whose main component is Al, a Ti layer to lie over said interconnection metal layer and an anti-reflection layer to lie over said Ti layer;

patterning said multi-layered structure into a shape of an interconnection pattern;

then carrying out a first heat treatment in which said interconnection pattern is heated so as to bring about an alloying reaction between Al in said interconnection metal layer and Ti layer, at least in the vicinity of an interface between said interconnection metal layer and Ti layer, and form an AlTi alloy layer;

growing an interlayer insulating film, burying said interconnection pattern;

planarizing the interlayer insulating film; and thereafter carrying out a second heat treatment in order to degas the interlayer insulating film.

2. The method of manufacturing a semiconductor device according to claim 1, wherein a film thickness of the Ti layer formed over said interconnection metal layer is in a range of 5 to 25 nm.

3. The method of manufacturing a semiconductor device according to claim 1, wherein said barrier layer has a TiN layer on a side lying next to the interconnection metal layer and a Ti layer on a side lying next to the insulating surface.

4. The method of manufacturing a semiconductor device according to claim 1, wherein, in the step of said first heat treatment to make the AlTi alloy layer, the heat treatment is carried out in an atmosphere of an inert gas under a condition that a temperature is 300 to 500° C.

* * * * *

UNITED STATES PATENT AND TRADEMARK OFFICE
CERTIFICATE OF CORRECTION

PATENT NO. : 6,448,172 B1
DATED : September 10, 2002
INVENTOR(S) : Yoshiaki Yamamoto et al.

It is certified that error appears in the above-identified patent and that said Letters Patent is hereby corrected as shown below:

<u>Title page,</u>
Item [56], please add the following FOREIGN PATENT DOCUMENTS:

-- JP 06-053216 02/1994
JP 55-138260 10/1980 --

Signed and Sealed this

Eighteenth Day of February, 2003

JAMES E. ROGAN
*Director of the United States Patent and Trademark Office*